(12) United States Patent
Huang et al.

(10) Patent No.: US 11,114,252 B2
(45) Date of Patent: Sep. 7, 2021

(54) METHOD FOR MANUFACTURING PEROVSKITE SOLAR CELL MODULE AND PEROVSKITE SOLAR CELL MODULE

(71) Applicant: CPC Corporation, Taiwan, Kaohsiung (TW)

(72) Inventors: Kuan-Chieh Huang, Kaohsiung (TW); Li-Chung Lai, Kaohsiung (TW); Chung-Kwang Lee, Kaohsiung (TW)

(73) Assignee: CPC Corporation, Taiwan, Kaohsiung (TW)

( * ) Notice: Subject to any disclaimer, the term of this patent is extended or adjusted under 35 U.S.C. 154(b) by 0 days.

(21) Appl. No.: 16/788,632

(22) Filed: Feb. 12, 2020

(65) Prior Publication Data
US 2021/0057169 A1 Feb. 25, 2021

(30) Foreign Application Priority Data
Aug. 23, 2019 (TW) .................... 108130150

(51) Int. Cl.
*H01G 9/20* (2006.01)
*H01G 9/00* (2006.01)
(Continued)

(52) U.S. Cl.
CPC ......... *H01G 9/2081* (2013.01); *H01G 9/0029* (2013.01); *H01L 51/422* (2013.01);
(Continued)

(58) Field of Classification Search
CPC .. H01G 9/2081; H01G 9/0029; H01L 51/442; H01L 51/4233; H01L 51/4226;
(Continued)

(56) References Cited

U.S. PATENT DOCUMENTS

| 5,348,589 A | 9/1994 | Arai et al. |
| 2003/0136331 A1* | 7/2003 | Ami .................. C30B 29/16 117/2 |

(Continued)

OTHER PUBLICATIONS

Ryosuke Yamauchi "Layer matching epitaxy of NiO thin films on atomically stepped sapphire (0001) substrates" Scientific Reports vol. 5, Article No. 14385 (2015) (Year: 2015).*

(Continued)

*Primary Examiner* — Michael Y Sun
(74) *Attorney, Agent, or Firm* — Karin L. Williams; Alan D. Kamrath; Mayer & Williams PC (57) ABSTRACT

Disclosures of the present invention mainly describe a method for manufacturing perovskite solar cell module. At first, a laser scribing is adopted for forming multi transparent conductive films (TCFs) on a transparent substrate. Subsequently, by using a first mask, multi HTLs, active layers, and ETLs are sequentially formed on the TCFs. Consequently, by the use of a second make, each of the ETLs is formed with an electrically connecting layer thereon, such that a perovskite solar cell module comprising a plurality of solar cell units is hence completed on the transparent substrate. It is worth explaining that, during the whole manufacturing process, each of the solar cell units is prevented from receiving bad influences that are provided by laser scribing or manufacture environment, such that each of the solar cell units is able to exhibit outstanding photoelectric conversion efficiency.

8 Claims, 12 Drawing Sheets

(51) Int. Cl.
*H01L 51/42* (2006.01)
*H01L 51/44* (2006.01)
*H01L 31/0463* (2014.01)
*H01L 21/203* (2006.01)
*H01L 21/768* (2006.01)
*H01L 45/00* (2006.01)
*H01L 51/00* (2006.01)

(52) U.S. Cl.
CPC ...... *H01L 51/4226* (2013.01); *H01L 51/4233* (2013.01); *H01L 51/442* (2013.01); *H01L 21/203* (2013.01); *H01L 21/76894* (2013.01); *H01L 31/0463* (2014.12); *H01L 45/147* (2013.01); *H01L 51/001* (2013.01); *H01L 2224/27912* (2013.01); *H01L 2224/27916* (2013.01); *H01L 2224/751* (2013.01); *H01L 2224/75102* (2013.01); *H01L 2224/76102* (2013.01); *H01L 2224/77102* (2013.01); *H01L 2224/78102* (2013.01); *H01L 2224/79102* (2013.01)

(58) Field of Classification Search
CPC ......... H01L 51/422; H01L 2224/77102; H01L 2224/78102; H01L 2224/79102; H01L 2224/27912; H01L 2224/27916; H01L 2224/751; H01L 45/147; H01L 21/76894; H01L 2224/75102; H01L 21/203; H01L 2224/76102; H01L 31/0463; H01L 51/001
See application file for complete search history.

(56) References Cited

U.S. PATENT DOCUMENTS

| | | | |
|---|---|---|---|
| 2013/0098424 A1* | 4/2013 | Tsuda | H01L 31/046 136/244 |
| 2016/0079552 A1* | 3/2016 | Su | H01L 51/0032 136/260 |
| 2016/0276611 A1 | 9/2016 | Oooka et al. | |
| 2017/0194102 A1* | 7/2017 | Huang | H01L 25/047 |
| 2018/0315870 A1* | 11/2018 | Snaith | H01L 31/0725 |

OTHER PUBLICATIONS

Qingyu Lei "Constructing oxide interfaces and heterostructures by atomic layer-by-layer laser molecular beam epitaxy" npj Quantum Materials vol. 2, Article No. 10 (2017) (Year: 2017).*

Kazuhiro Kawashima "Combinatorial screening of halide perovskite thin films and solar cells by mask-defined IR laser molecular beam epitaxy" Science and Technology of Advanced Materials, 2017 vol. 18, No. 1, 307-315 (Year: 2017).*

* cited by examiner

METHOD FOR MANUFACTURING PEROVSKITE SOLAR CELL MODULE AND PEROVSKITE SOLAR CELL MODULE

BACKGROUND OF THE INVENTION

1. Field of the Invention

The present invention relates to the technology field of solar cells, and more particularly to a method for manufacturing perovskite solar cell module and a perovskite solar cell module.

2. Description of the Prior Art

Wind energy and solar energy are two well-known and different types of renewable energies, wherein solar cell is a conventional electricity generating unit capable of converting the solar energy to an electrical power by using specific photovoltaic materials. Solar cell technologies are classified into three generations. First generation solar cells are mainly based on silicon wafers and typically demonstrate high conversion performance about 15-20%. On the other hand, second generation thin-film solar cells are based on amorphous silicon and compound semiconductors, such as CIS, CIGS, CdTe, and GaAs.

Figure 1:
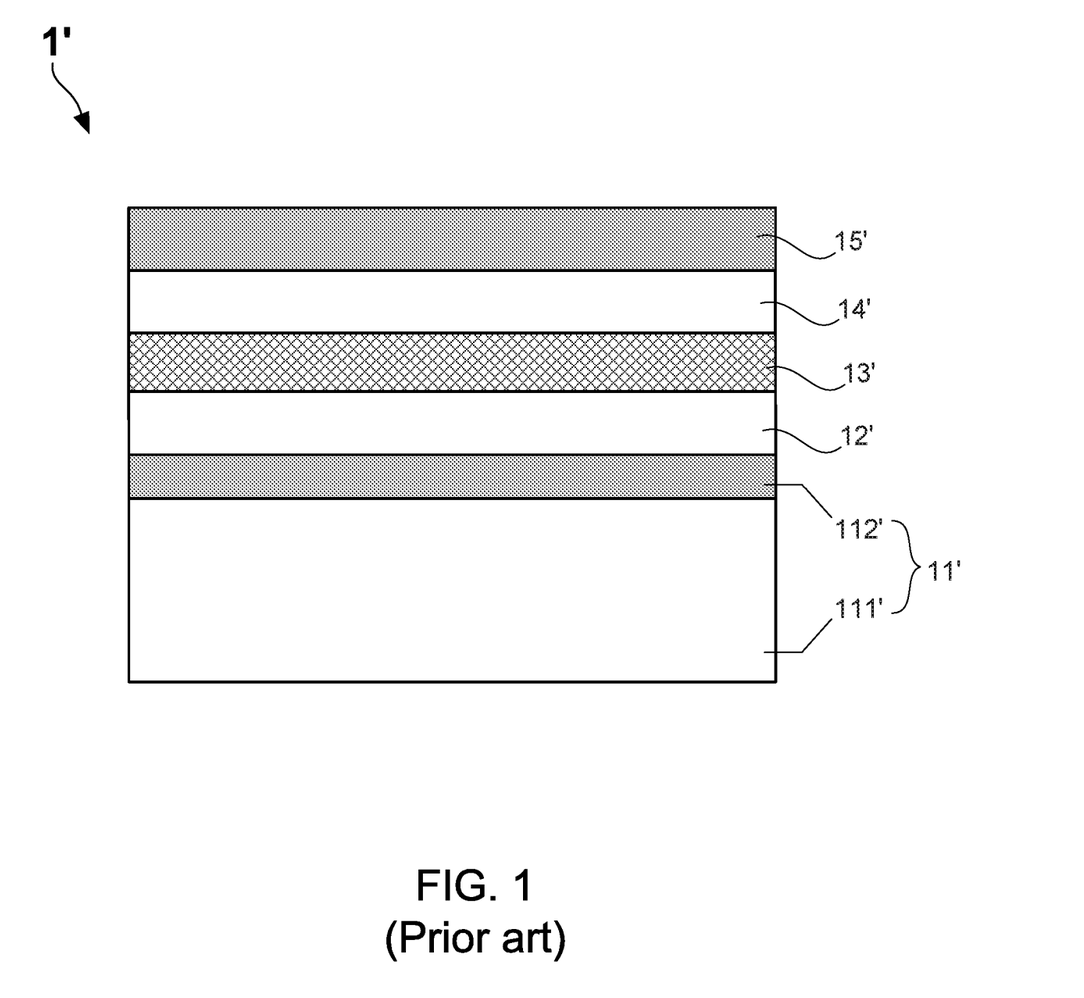
FIG. 1 shows a cross-sectional view of a conventional perovskite solar cell.

Third generation solar cells are potentially able to overcome the Shockley-Queisser limit of 31-41% power efficiency for single bandgap solar cells, including dye-sensitized solar cell (DSSC), organic polymer solar cell, organic small molecule solar cells, and organic-inorganic hybrid perovskite solar cells. FIG. 1 shows a cross-sectional view of a conventional perovskite solar cell, which comprises: a transparent conductive substrate 11', a hole transport layer (HTL) 12', an active layer 13', an electron transport layer (ETL) 14', and a metal layer 15'. In which, the transparent conductive substrate 11' consists of a transparent substrate 111' and a transparent conducting oxide (TCO) layer 112' formed on the transparent substrate 111'. As described more in detail below, the TCO layer 112' is commonly made of indium tin oxide (ITO), and the active layer 13' is made of a light-absorbing material such as perovskite.

It is worth noting that, U.S. patent publication No. US 2016/0276611 A1 has disclosed a photoelectric conversion device comprising a plurality of photoelectric conversion units. From FIG. 3A that is provided in the disclosures of the forgoing U.S. patent publication, it is understood that there is a transparent electrode layer (4A, 4B, 4C) firstly formed on a transparent substrate (2) when manufacturing the photoelectric conversion device. Subsequently, a photoelectric conversion layer (5X) is formed on the transparent electrode layer (4A, 4B, 4C). Next, FIG. 3B that is provided in the disclosures of the forgoing U.S. patent publication depicts that, a scribing process is applied to the photoelectric conversion layer (5X) for forming a plurality of scribe lines on the photoelectric conversion layer (5X), thereby dividing the photoelectric conversion layer (5X) to a plurality of photoelectric conversion films (5A, 5B, 5C). Eventually, FIG. 3C that is provided in the disclosures of the forgoing U.S. patent publication illustrates that, a plurality of electrical connection layers (6A, 6B, 6C) are formed on the plurality of photoelectric conversion films (5A, 5B, 5C), respectively, such that the fabrication of a photoelectric conversion device comprising a plurality of photoelectric conversion units (3A, 3B, 3C) is therefore completed.

The forgoing U.S. patent publication has taught how to manufacture one photoelectric conversion device consisting of multi photoelectric conversion units. However, the disclosed manufacturing method of the photoelectric conversion device is found to show shortcomings in practical use. As described more in detail below, the disclosed manufacturing method achieves the formation of the scribe lines on the photoelectric conversion layer (as shown in FIG. 3B) through mechanical scribing, causing a residual of a relatively-soft material like perovskite active layer remain on a relatively-hard material such as ITO layer. As a result, interfacial resistance between the ITO layer and the most top layer (i.e., the electrical connection layer) of each of the photoelectric conversion units is hence increased. In spite of the fact that the enhancement of the mechanical scribing force is helpful in avoiding the occurrence of the interfacial resistance rising, the strengthened mechanical scribing force causes damages of the ITO layer instead.

Laser scribing is another way to divide the photoelectric conversion layer to a plurality of photoelectric conversion films. However, practical experiences of using the laser scribing has revealed that, when a laser beam is directed to divide one electrical connection layer to a plurality of electrical connection layers, parts of the plurality of electrical connection layers are led to have broken or incomplete portions that are caused by the low-power laser beam, thereby resulting in that the multi photoelectric conversion units are inadvertently short-circuited. On the contrary, high-power laser beam may lead the active layer that is arranged under the electrical connection layer to be damaged or broken. Accordingly, U.S. Pat. No. 5,348,589 teaches the way to protect the active layer from being damaged by the high-power layer beam is forming an insulating layer (strip) between the active layer and the electrical connection layer. However, this way not only causes the manufacturing process steps of the photoelectric conversion device comprising multi photoelectric conversion units become more complex, but also leads the whole manufacturing cost of the photoelectric conversion device to be increased.

In addition, practical experiences further reveal that, the forgoing laser scribing is commonly carried out in air environment. It is worth noting that, oxygen and moisture existing in air environment may produce a considerable influence on the crystal structure of the perovskite active layer 13', thereby reducing the stability of the perovskite active layer 13'. On the other hand, during the application of the laser scribing, removal of a portion of a specific material is achieved after the portion of the specific material absorbs a laser beam. However, in case of two materials having similar band gap being stacked to a stack structure, it is difficult to precisely control the laser beam to merely complete the removal of the top-layer material of the stack structure. In a common case, there are an incomplete scribing (removal) and a surface scribing (removal) respectively achieving on the top-layer material and the bottom-layer material of the stack structure. It needs to know that, the incomplete scribing (removal) of the top-layer material(s) is found to cause that the multi photoelectric conversion units are inadvertently short-circuited, thereby reducing the conversion efficiency of the photoelectric conversion device.

From above descriptions, it is understood that, there is a need to develop and provide a new method for forming a perovskite solar cell module that comprises a plurality of perovskite solar cell units on an identical transparent substrate. In view of that, inventors of the present application have made great efforts to make inventive research and eventually provided a method for manufacturing perovskite solar cell module and perovskite solar cell module.

SUMMARY OF THE INVENTION

The primary objective of the present invention is to disclose a method for manufacturing perovskite solar cell module. When carrying out this novel method, a laser scribing is firstly adopted for forming a plurality of transparent conductive films (TCFs) on a transparent substrate. Subsequently, by using a first mask, a plurality of HTLs, a plurality of active layers, and a plurality of ETLs are sequentially formed on the TCFs. Consequently, by using of a second make, each of the ETLs is formed with an electrically connecting layer thereon, such that a perovskite solar cell module comprising a plurality of solar cell units is hence completed on the transparent substrate. It is worth explaining that, during the whole manufacturing process, each of the solar cell units is prevented from receiving bad influences that are provided by laser scribing or manufacture environment, such that each of the solar cell units is guaranteed to exhibit outstanding photoelectric conversion efficiency.

For achieving the primary objective of the present invention, the present invention provides an embodiment of the method for manufacturing perovskite solar cell module, comprising following steps:

(1) providing a transparent conductive substrate that comprises a transparent substrate and a transparent conductive layer formed on the transparent substrate;

(2) scribing the transparent conductive layer by using a laser beam, thereby forming a plurality of scribe lines on the transparent conductive layer, such that the transparent conductive layer is divided into a plurality of transparent conductive films by the plurality of scribe lines;

(3) positioning a first mask over the plurality of transparent conductive films, and then forming a hole transport film on each of the plurality of transparent conductive films through the first mask, wherein the hole transport film has a thickness in a range between 5 nm and 60 nm;

(4) positioning the first mask over the plurality of hole transport films, and subsequently forming an active layer on each of the plurality of hole transport films by using the first mask in combination with a vacuum coating apparatus, wherein a vacuum coating temperature of the vacuum coating apparatus is modulated to be in a range between 70° C. and 150° C., and a layer width of each of the plurality of active layers and a layer width of each of the plurality of transparent conductive films having a width ratio that is in a range between 0.75 and 9;

(5) positioning the first mask over the plurality of active layer, and then forming an electron transport film on each of the plurality of active layers by using the first mask in combination with the vacuum coating apparatus, wherein a flow rate of an oxygen feeding into the vacuum coating apparatus is modulated to be in a range between 0.1 sccm and 5 sccm; and (6) disposing a second mask over the plurality of electron transport films, and subsequently forming an electrical connection layer on each of the plurality of electron transport films through the second mask.

In addition, the present invention also provides an embodiment of a perovskite solar cell module which is fabricated by using above-introduced method for manufacturing perovskite solar cell module.

Moreover, in order to achieve the primary objective of the present invention, the present invention provides an embodiment of the perovskite solar cell module, comprising:

a transparent conductive substrate, comprising a transparent substrate and a transparent conductive layer formed on the transparent substrate;

a plurality of scribe lines forming on the transparent conductive layer, so as to divide the transparent conductive layer into a plurality of transparent conductive films;

a plurality of hole transport films, being respectively formed on the plurality of transparent conductive films, wherein each of the plurality of hole transport films has a thickness in a range between 5 nm and 60 nm;

a plurality of active layers, being respectively formed on the plurality of hole transport films, wherein a layer width of each of the plurality of active layers and a layer width of each of the plurality of transparent conductive films have a width ratio that is in a range between 0.75 and 9;

a plurality of electron transport films, being formed on the plurality of active layers, respectively; and a plurality of electrical connection layers, being formed on the plurality of electron transport films, respectively;

wherein a plurality of perovskite solar cells are provided on the transparent substrate, and each of the plurality of perovskite solar cells comprises one of the plurality of transparent conductive films, one of the plurality of hole transport films, one of the plurality of active layers, one of the plurality of electron transport films, and one of the plurality of electrical connection layers.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a method for manufacturing perovskite solar cell module and a perovskite solar cell module that are disclosed by the present invention, embodiments of the present invention will be described in detail with reference to the attached drawings hereinafter.

Perovskite Solar Cell Module Comprising a Plurality of Solar Cell Units

Figure 2:
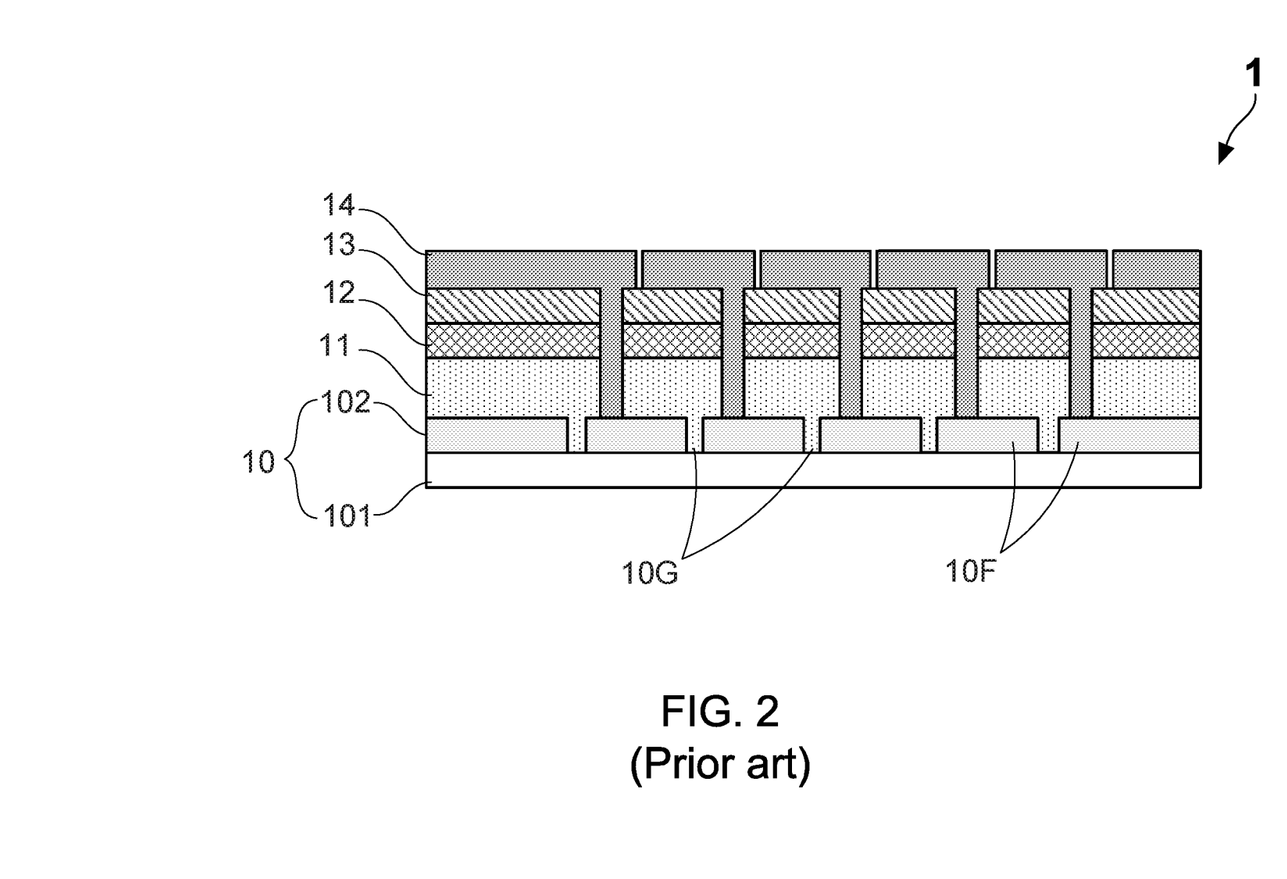
FIG. 2 shows a cross-sectional view of a perovskite solar cell module according to the present invention.

With reference to FIG. 2, there is shown a cross-sectional view of a perovskite solar cell module according to the present invention. As FIG. 2 shows, the perovskite solar cell module 1 of the present invention comprises: a transparent conductive substrate 10, a plurality of scribe lines 10G, a plurality of hole transport films 11, a plurality of active layers 12, a plurality of electron transport films 13, and a plurality of electrical connection layers 14. In which, the transparent conductive substrate 10 consists of a transparent substrate 101 and a transparent conductive layer 102 formed on the transparent substrate 101. In one practicable embodiment, the transparent conductive layer 102 is made of a transparent conductive material that is selected from the group consisting of indium tin oxide (ITO), fluorine-doped tin oxide (FTO), indium zinc oxide (IZO), gallium doped zinc oxide (GZO), and aluminum-doped zinc oxide (AZO).

Figure 3:
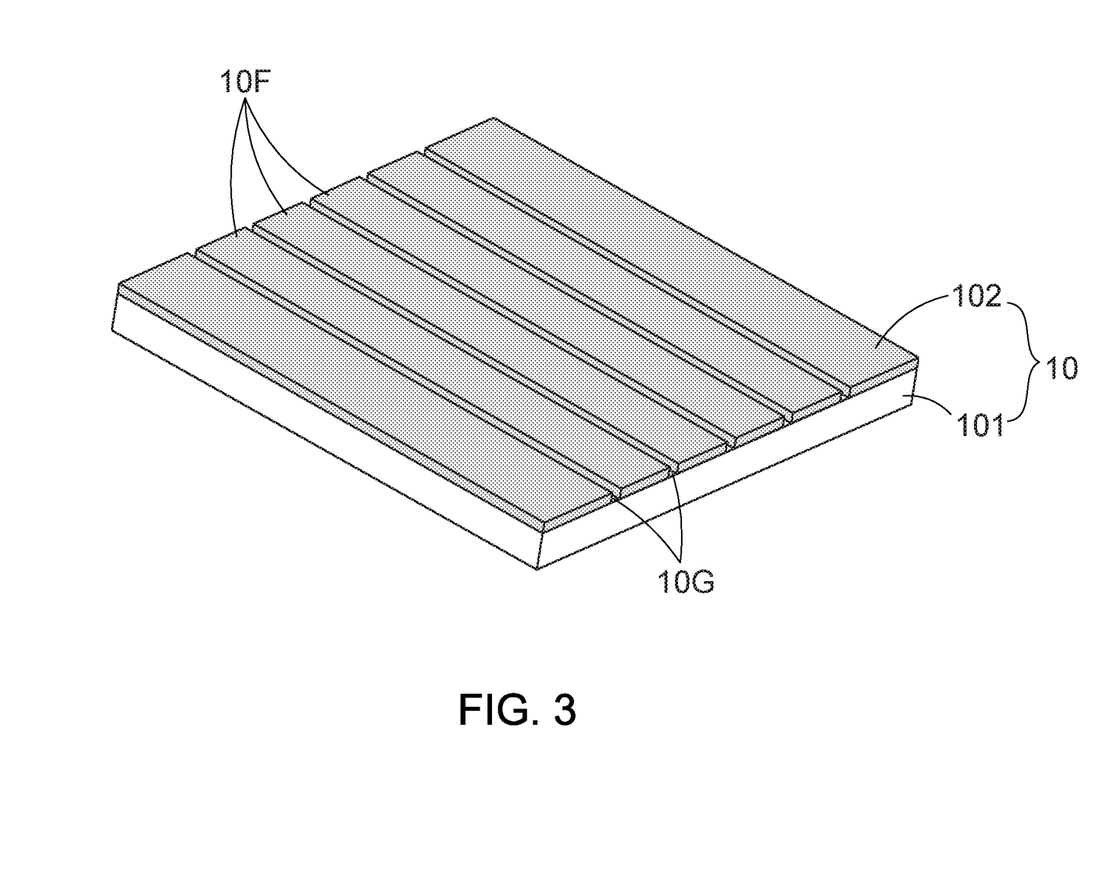
FIG. 3 shows a stereo diagram for depicting a substrate and a transparent conductive layer of the perovskite solar cell module.

Continuously referring to FIG. 2, and please simultaneously refer to FIG. 3, which illustrates a stereo diagram for depicting the substrate 101 and the transparent conductive layer 102. In the present invention, a laser beam is utilized for carrying out a laser scribing process so as to achieve a patterning process on the transparent conductive layer 102. As FIG. 2 and FIG. 3 show, the laser beam scribes the transparent conductive layer 102, thereby forming a plurality of scribe lines 10G on the transparent conductive layer 102, such that the transparent conductive layer 102 is divided into a plurality of transparent conductive films 10F by the plurality of scribe lines 10G.

On the other hand, the plurality of hole transport films 11 are formed on the plurality of transparent conductive films 10F, respectively. Moreover, the plurality of active layers 12 are further formed on the plurality of hole transport films 11, respectively. In which, the hole transport film 11 is made of an oxide that is selected from the group consisting of NiO and $MoO_3$.

Moreover, the present invention adopts a photoelectric conversion material to fabricate the active layer 12, wherein the photoelectric conversion material has a chemical formula of $A_xB_{1-x}CD_yE_{3-y}$. As described more in detail below, x is an integer in a range between 0 and 1, y is an integer in a range between 0 and 3, A and B are both an positive ion that is selected from the group consisting of $Cs^+$, $CH_3NH_3^+$ and $H_2N=CHNH_2^+$, and D and E are both an negative ion that is selected from the group consisting of $Cl^-$, $Br^-$ and $I^-$.

As described more in detail below, the plurality of electron transport films 13 are respectively formed on the plurality of active layers 12, and the plurality of electrical connection layers 14 are formed on the plurality of electron transport films 13, respectively. In one practicable embodiment, the electron transport film 13 is made of a manufacturing material that is selected from the group consisting of fullerene (C60), fullerene derivative (PCBM), TiO2, and ZnO. On the other hand, the electrical connection layer 14 can be made of aluminum (Al), silver (Ag), or gold (Au).

It is worth noting that, FIG. 2 particularly depicts that a plurality of perovskite solar cell units are provided on the transparent substrate 101, and each of the plurality of perovskite solar cell units comprises one of the plurality of transparent conductive films 10F, one of the plurality of hole transport films 11, one of the plurality of active layers 12, one of the plurality of electron transport films 13, and one of the plurality of electrical connection layers 14. Briefly speaking, the present invention utilizes a laser scribing to firstly form a plurality of transparent conductive films 10F on a transparent substrate 101. Subsequently, a plurality of hole transport films 11, a plurality of active layers 12, a plurality of electron transport films 13, and a plurality of electrical connection layers 14 are sequentially formed on the transparent conductive films 10F. Consequently, a perovskite solar cell module 1 comprising a plurality of solar cell units is hence completed on the transparent substrate 101.

Method for Manufacturing Perovskite Solar Cell Module

Figure 4:
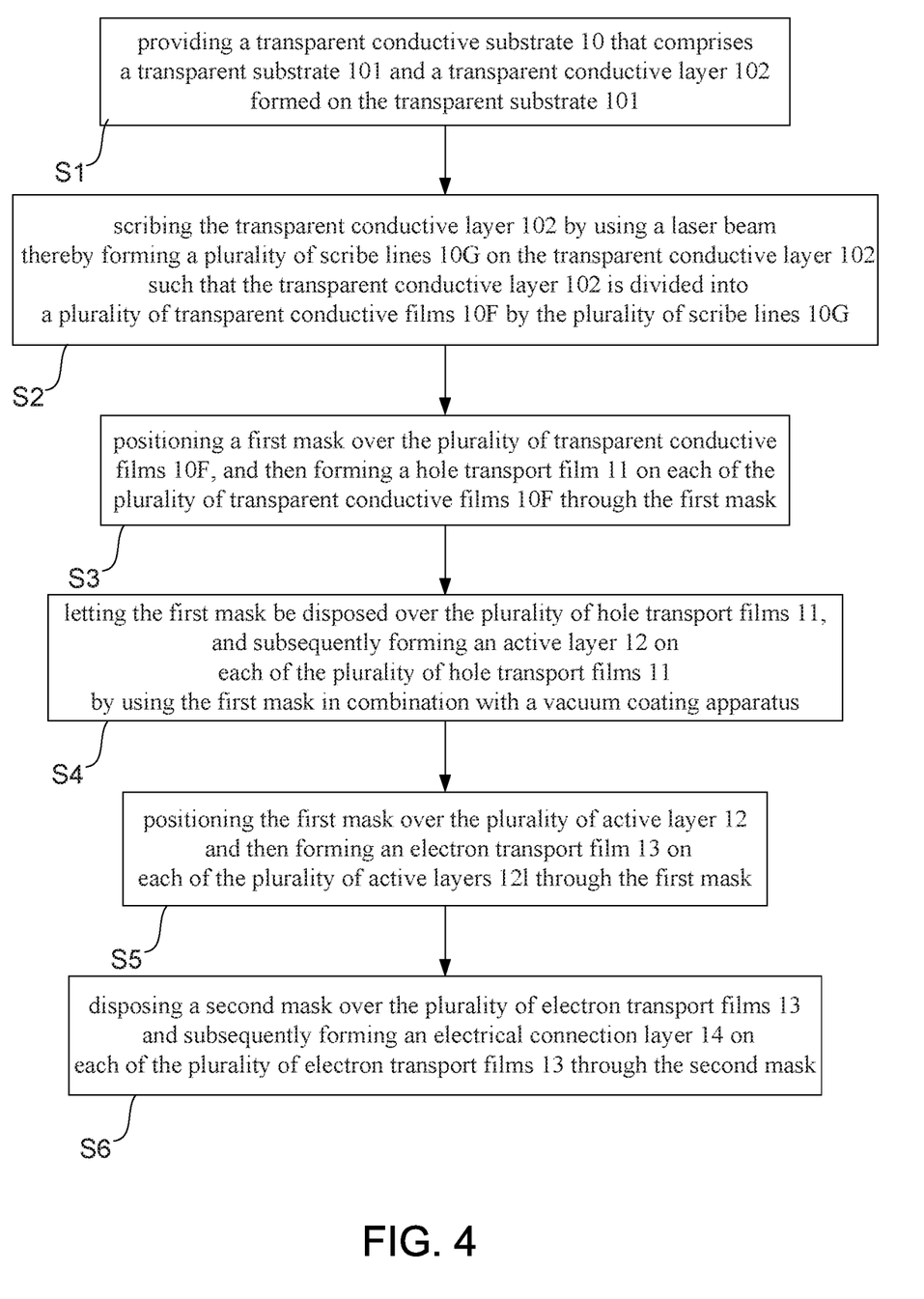
FIG. 4 shows a flowchart diagram of a method for manufacturing perovskite solar cell module according to the present invention.

With reference to FIG. 4, there is shown a flowchart diagram of a method for manufacturing perovskite solar cell module according to the present invention. Moreover, FIG. 5 to FIG. 11 show schematic diagrams for describing the manufacturing process of the perovskite solar cell module 1 that is illustrated in FIG. 2. Herein, it needs to firstly explain that, in FIGS. 5-11, diagram (a) is used for describing the manufacturing process by way of presenting a top view of a semi-finished product or a finished product of the perovskite solar cell module. On the other hand, diagram (b) in FIGS. 5-11 is utilized for describing the manufacturing process by way of presenting a cross-sectional view of a semi-finished product or a finished product of the perovskite solar cell module.

Figure 5:
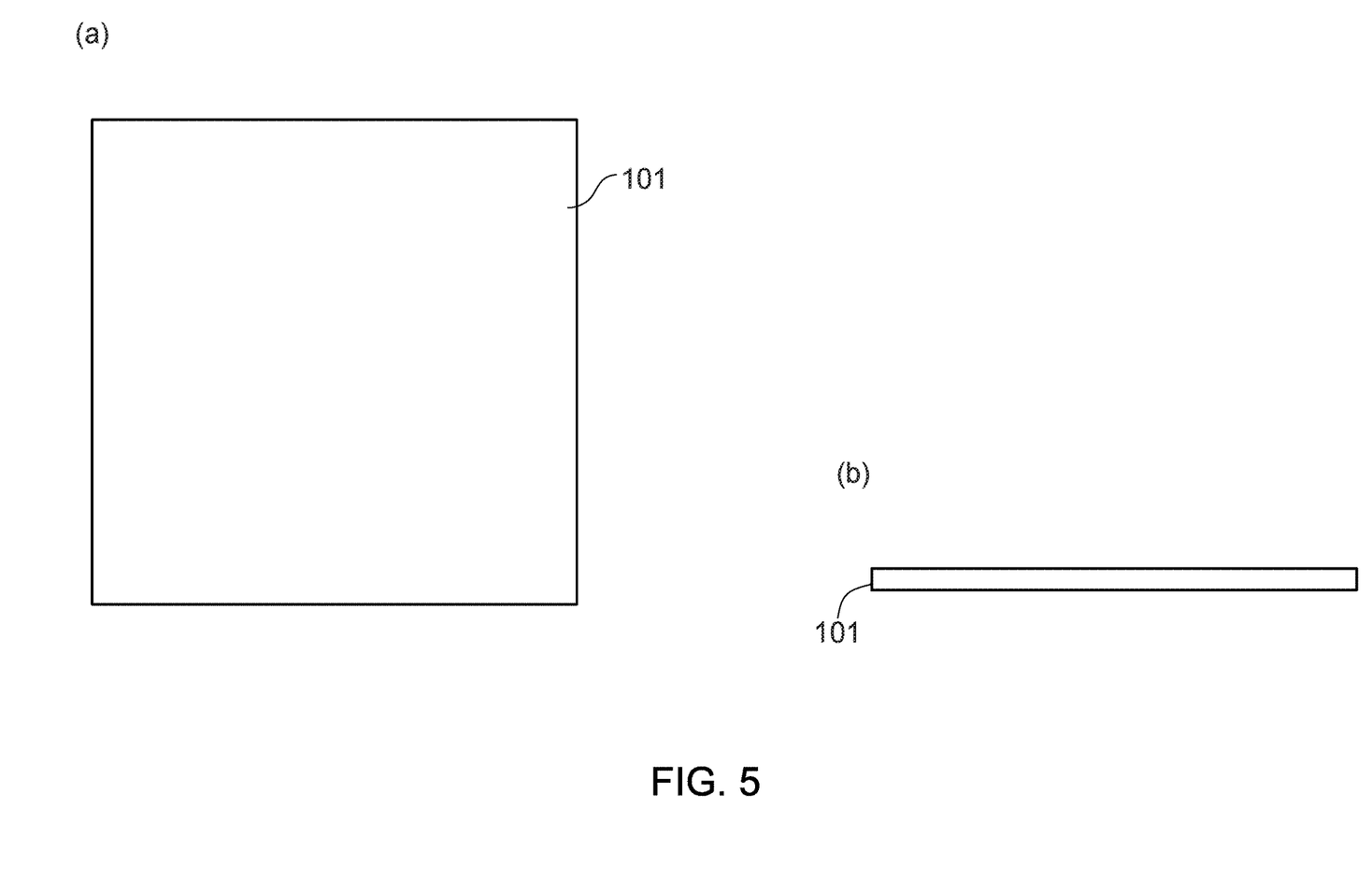
FIG. 5 shows a schematic diagram for describing the manufacturing process of the perovskite solar cell module.
Figure 6:
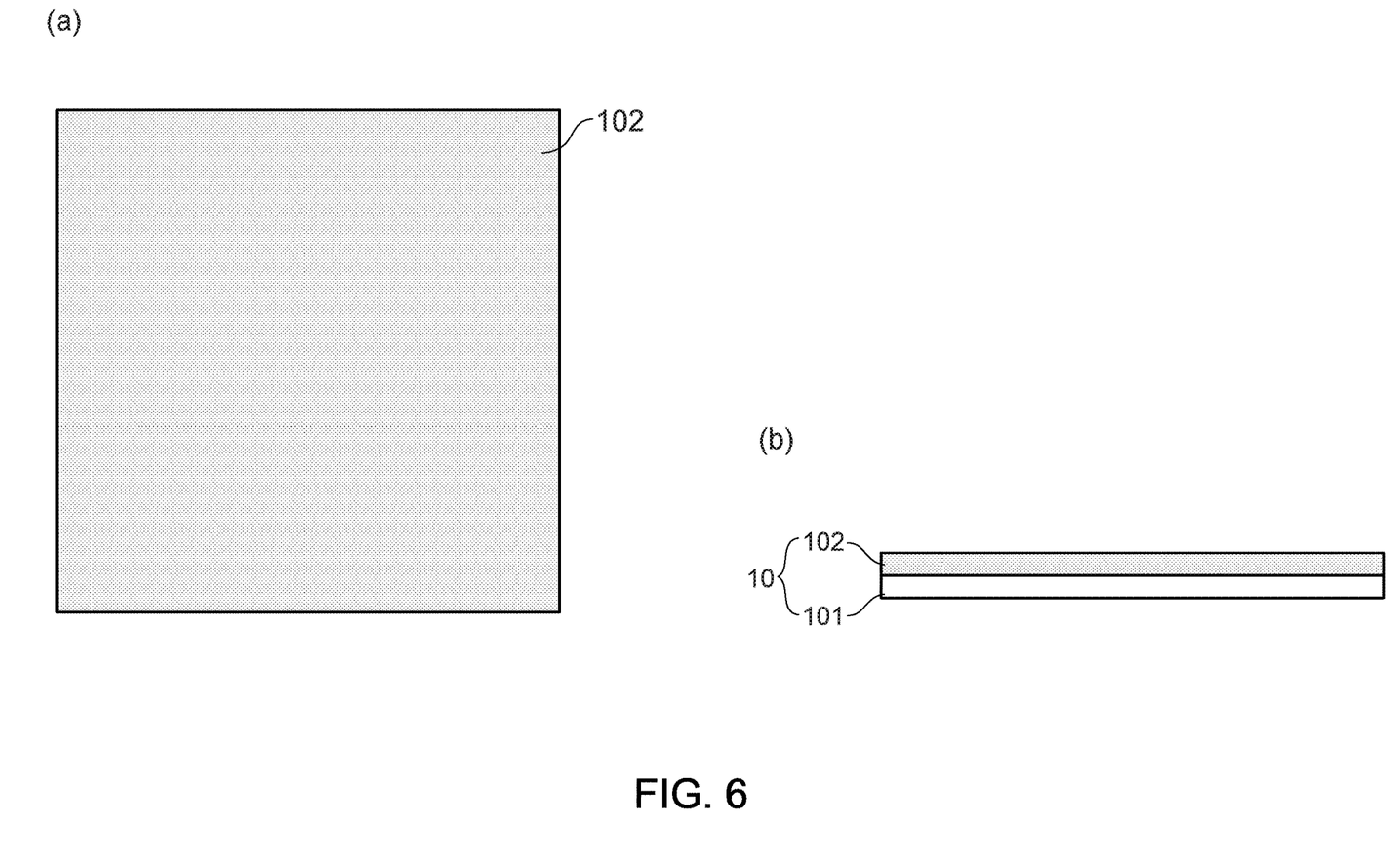
FIG. 6 shows a schematic diagram for describing the manufacturing process of the perovskite solar cell module.

As FIG. 4, FIG. 5 and FIG. 6 show, the method flow is firstly proceeded to step S1: providing a transparent conductive substrate 10 that comprises a transparent substrate 101 and a transparent conductive layer 102 formed on the transparent substrate 101. In one practicable embodiment, a sputtering equipment or an electron beam evaporation apparatus can be adopted for carrying out the forgoing step S1, so as to form an ITO layer (i.e., the transparent conductive layer 102) on the transparent substrate 101. Of course, it is able to purchase a commercial product of the transparent conductive substrate 10, wherein the commercial product comprises a glass substrate and an ITO film formed on the glass substrate.

Figure 7:
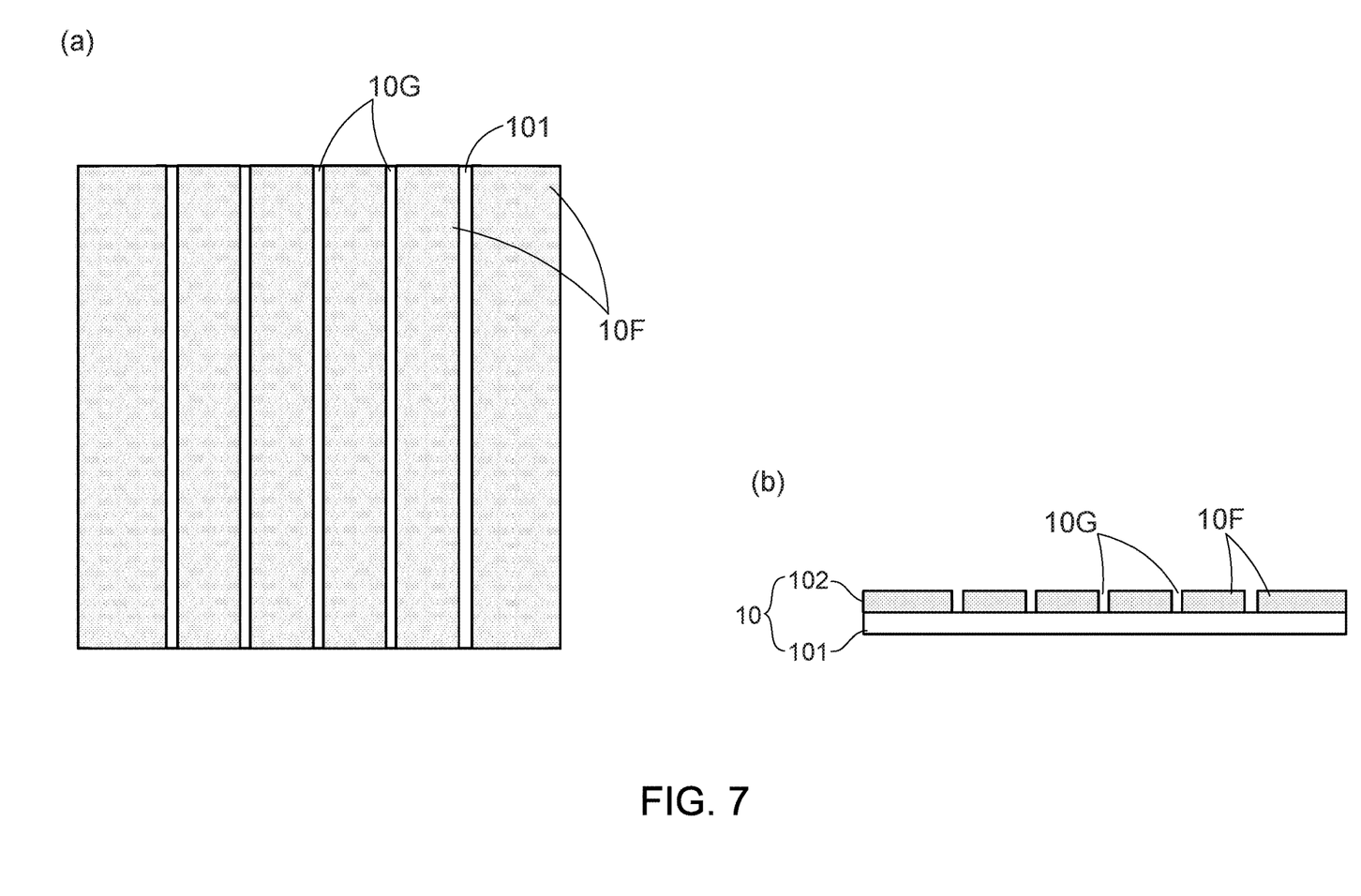
FIG. 7 shows a schematic diagram for describing the manufacturing process of the perovskite solar cell module.

From FIG. 4 and FIG. 7, it is understood that the method flow is subsequently proceeded to step S2: scribing the transparent conductive layer 102 by using a laser beam, thereby forming a plurality of scribe lines 10G on the transparent conductive layer 102, such that the transparent conductive layer 102 is divided into a plurality of transparent conductive films 10F by the plurality of scribe lines 10G. Herein, it needs to particularly explain that, the present invention utilizes the laser scribing technology to achieve a patterning process on the transparent conductive layer 102, instead of the normal photolithography technology. The principal reason is that width (i.e., gap between two transparent conductive films 10F) of the scribe line 10G is easy to be controlled in case of the laser scribing technology is adopted for achieving the patterning process of the transparent conductive layer 102. Briefly speaking, in case of using the laser scribing technology, the scribe line 10G can be made to have a smaller width that is able to meet the standard requirements. In spite of the fact that the normal photolithography technology can also be utilized for making the small-width scribe line 10G, toxic chemicals such as photoresist agent and development agent that are adopted in the execution of the photolithography technology are well-known hurting human body.

Figure 8:
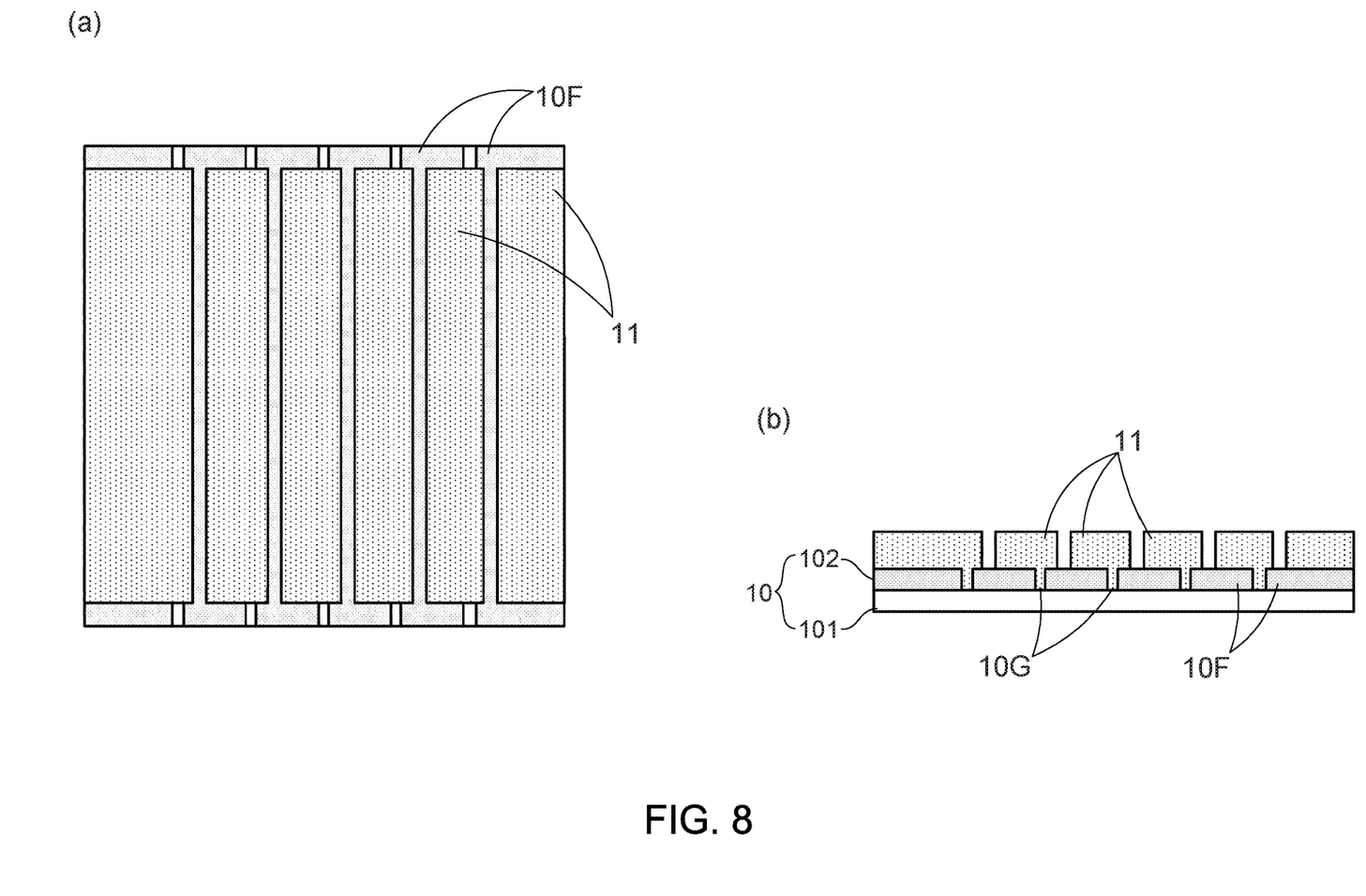
FIG. 8 shows a schematic diagram for describing the manufacturing process of the perovskite solar cell module.

As FIG. 4 and FIG. 8 show, the method flow is next proceeded to step S3: positioning a first mask over the plurality of transparent conductive films 10F, and then forming a hole transport film 11 on each of the plurality of transparent conductive films 10F through the first mask, wherein each of the plurality of hole transport films 11 has a thickness in a range between 5 nm and 60 nm. However, before starting the step S3, it needs to apply a surface treatment to the transparent substrate 101 that is formed the plurality of transparent conductive films 10F thereon, such as an ozone-ultraviolet illuminating treatment. It is easy to know that, after the first mask is disposed over the plurality of transparent conductive films 10F, a vacuum film deposition equipment like the electron beam evaporation apparatus is utilized for forming a hole transport film 11 (such as a NiO film) on each of the plurality of transparent conductive films 10F through the first mask. After that, a thermal annealing treatment is subsequently applied to the transparent substrate 101 that is formed the plurality of hole transport films 11 and the plurality of transparent conductive films 10F thereon.

Figure 9:
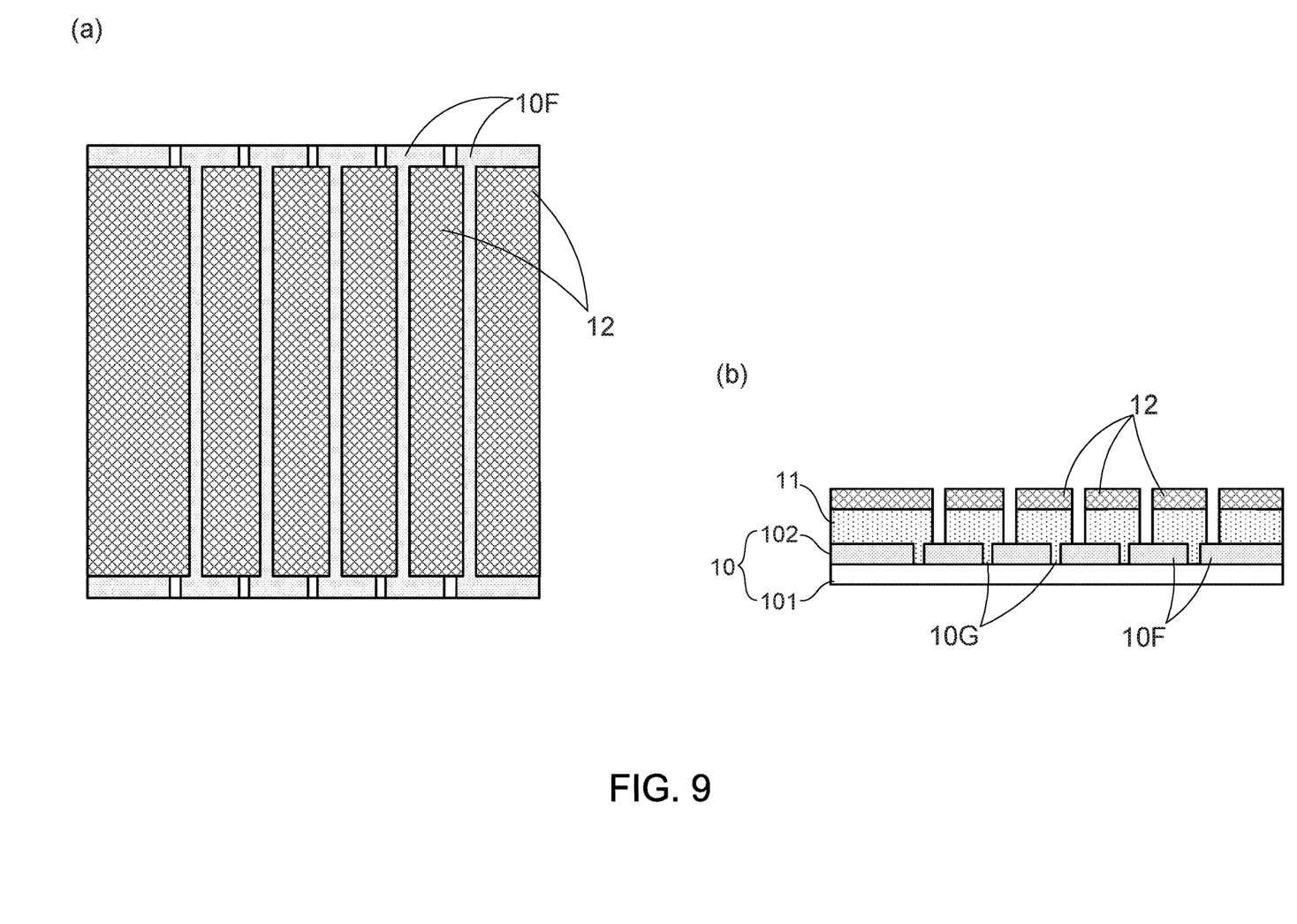
FIG. 9 shows a schematic diagram for describing the manufacturing process of the perovskite solar cell module.
Figure 9A:
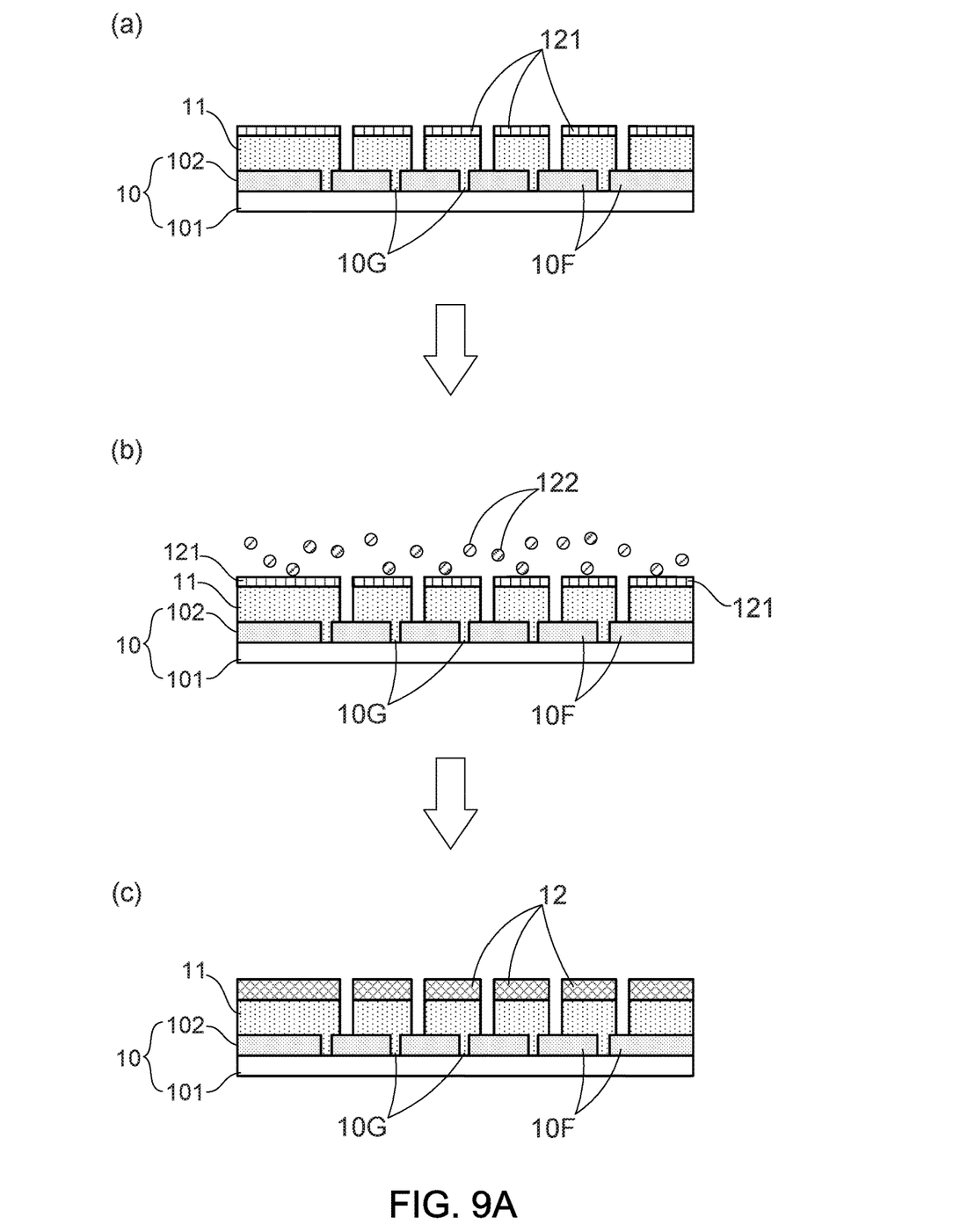
FIG. 9A shows a schematic diagram for describing a two-step manufacturing process.

From FIG. 4 and FIG. 9, it is understood that the method flow is continuously proceeded to step S4: letting the first mask be disposed over the plurality of hole transport films 11, and subsequently forming an active layer 12 on each of the plurality of hole transport films 11 by using the first mask in combination with a vacuum coating apparatus, wherein a vacuum coating temperature of the vacuum coating apparatus is modulated to be in a range between 70° C. and 150° C., and a layer width of each of the plurality of active layers 45 and a layer width of each of the plurality of transparent conductive films 10F having a width ratio that is in a range between 0.75 and 9. Particularly, the present invention adopts a two-step manufacturing process to complete the step S4. FIG. 9A shows a schematic diagram for describing the two-step manufacturing process. As diagram (a) of FIG. 9A shows, during the execution of the two-step manufacturing process, it firstly positions the first mask over the plurality of hole transport films 11, and then forms a first material layer 121 on each of the plurality of hole transport films 11 through the first mask. Next, as diagrams (b) and (c) of FIG. 9A show, a second material layer 122 is subsequently formed on each of the plurality of first material layer 121 through the first mask, thereby forming the respective active layers 12 that has a range between 200 nm and 500 nm on the respective hole transport films 11 after a reaction between each of the plurality of first material layers 121 and each of the plurality of second material layers 122 is completed. For example, thermal evaporation can be used for fabricating the first material layers 121, wherein the first material layer 121 is made of a metal halide that is selected from the group consisting of $PbCl_2$, $PbBr_2$, $PbI_2$, $SnI_2$, and $GeI_2$. On the other hand, chemical vapor deposition can be used for fabricating the second material layers 121, wherein a manufacturing material of the second material layer 122 is selected from the group consisting of CsCl, CsBr, CsI, $CH_3NH_3Cl$, $CH_3NH_3Br$, $CH_3NH_3I$, and $H_2N\!=\!CHNH_2I$. As a result, after a reaction between each of the plurality of first material layers ($PbI_2$) 121 and each of the plurality of second material layers ($H_2N\!=\!CHNH_2I$) 122 is completed, the respective active layers ($H_2N\!=\!CHNH_2PbI_3$) 12 are therefore formed on the respective hole transport films 11.

Figure 10:
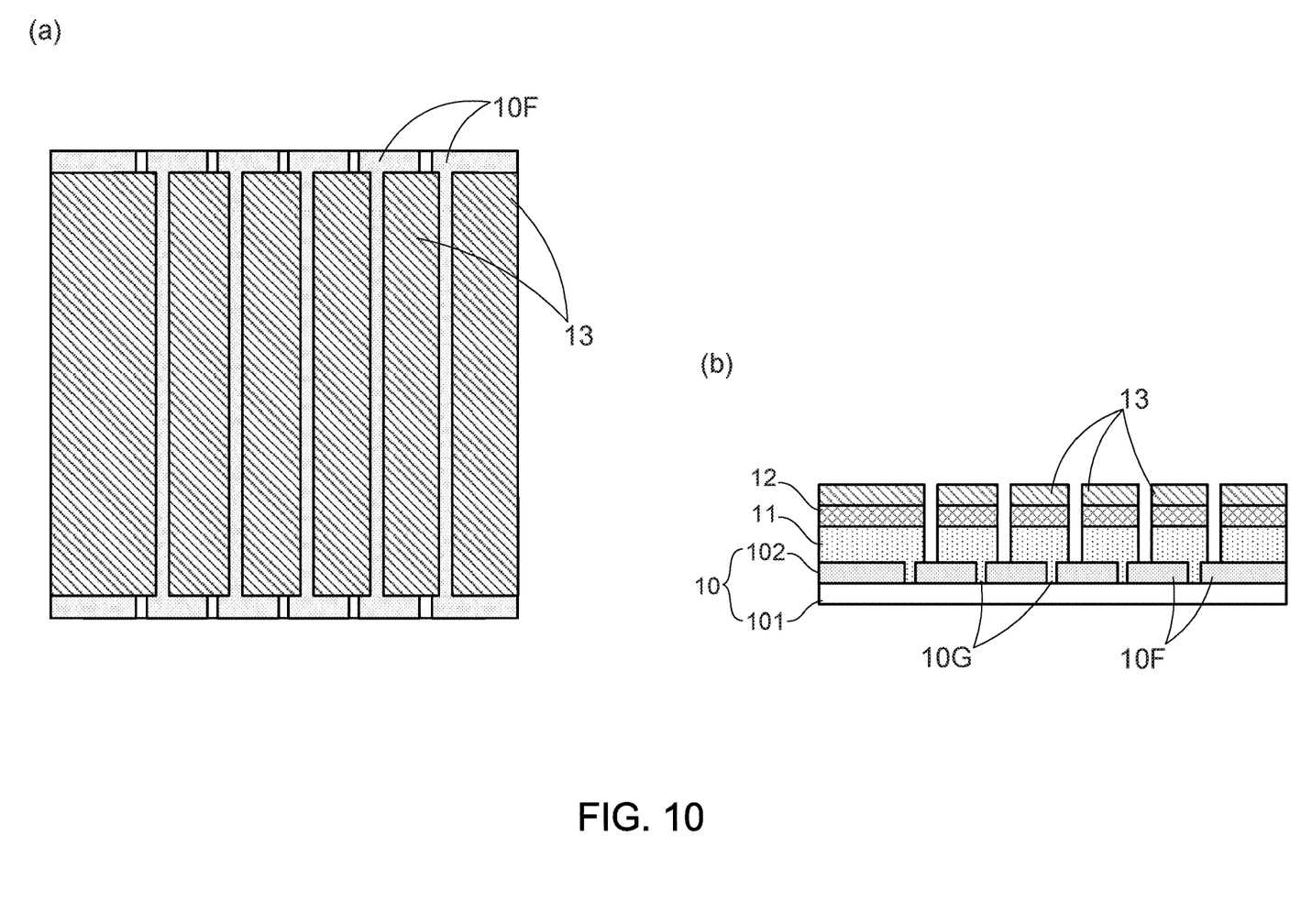
FIG. 10 shows a schematic diagram for describing the manufacturing process of the perovskite solar cell module.

As FIG. 4 and FIG. 10 show, the method flow is next proceeded to step S5: positioning the first mask over the plurality of active layer 12, and then forming an electron transport film 13 on each of the plurality of active layers 121 through the first mask. For instance, a thermal evaporation completed by a vacuum coating apparatus can be used for fabricating the electron transport films 13, wherein the electron transport film 13 is made of fullerene (C60), fullerene derivative (PCBM), TiO2, or ZnO. During the thermal evaporation, a flow rate of an oxygen feeding into the vacuum coating apparatus is modulated to be in a range between 0.1 sccm and 5 sccm. It needs to know that, U.S. Pat. No. 5,348,589 utilizes the laser scribing technology to make the scribe lines. However, practical experiences further reveal that, the forgoing laser scribing is commonly carried out in air environment. It is worth noting that, oxygen and moisture existing in air environment may produce a considerable influence on the crystal structure of the perovskite active layer, thereby reducing the stability of the perovskite active layer. On the other hand, during the application of the laser scribing, removal of a portion of a specific material is achieved after the portion of the specific material absorbs a laser beam. However, in case of two materials having similar band gap being stacked to a stack structure, it is difficult to precisely control the laser beam to merely complete the removal of the top-layer material of the stack structure. In a common case, there are an incomplete scribing (removal) and a surface scribing (removal) respectively achieving on the top-layer material and the bottom-layer material of the stack structure. It needs to know that, the incomplete scribing (removal) of the top-layer material (s) is found to cause that the multi photoelectric conversion units are inadvertently short-circuited, thereby reducing the conversion efficiency of the photoelectric conversion device.

Accordingly, when executing the proposed method of the present invention, a laser scribing is firstly adopted for forming a plurality of transparent conductive films 10F on a transparent substrate 101. Subsequently, by using an identical first mask, a plurality of hole transport films 11, a plurality of active layers 12, and a plurality of electron transport films 13 are sequentially formed on the transparent conductive films 10F. It is worth to explaining that, during the whole manufacturing process, each of the solar cell units is prevented from receiving bad influences that are provided by laser scribing or manufacture environment, such that each of the solar cell units is guaranteed to exhibit outstanding photoelectric conversion efficiency.

Figure 11:
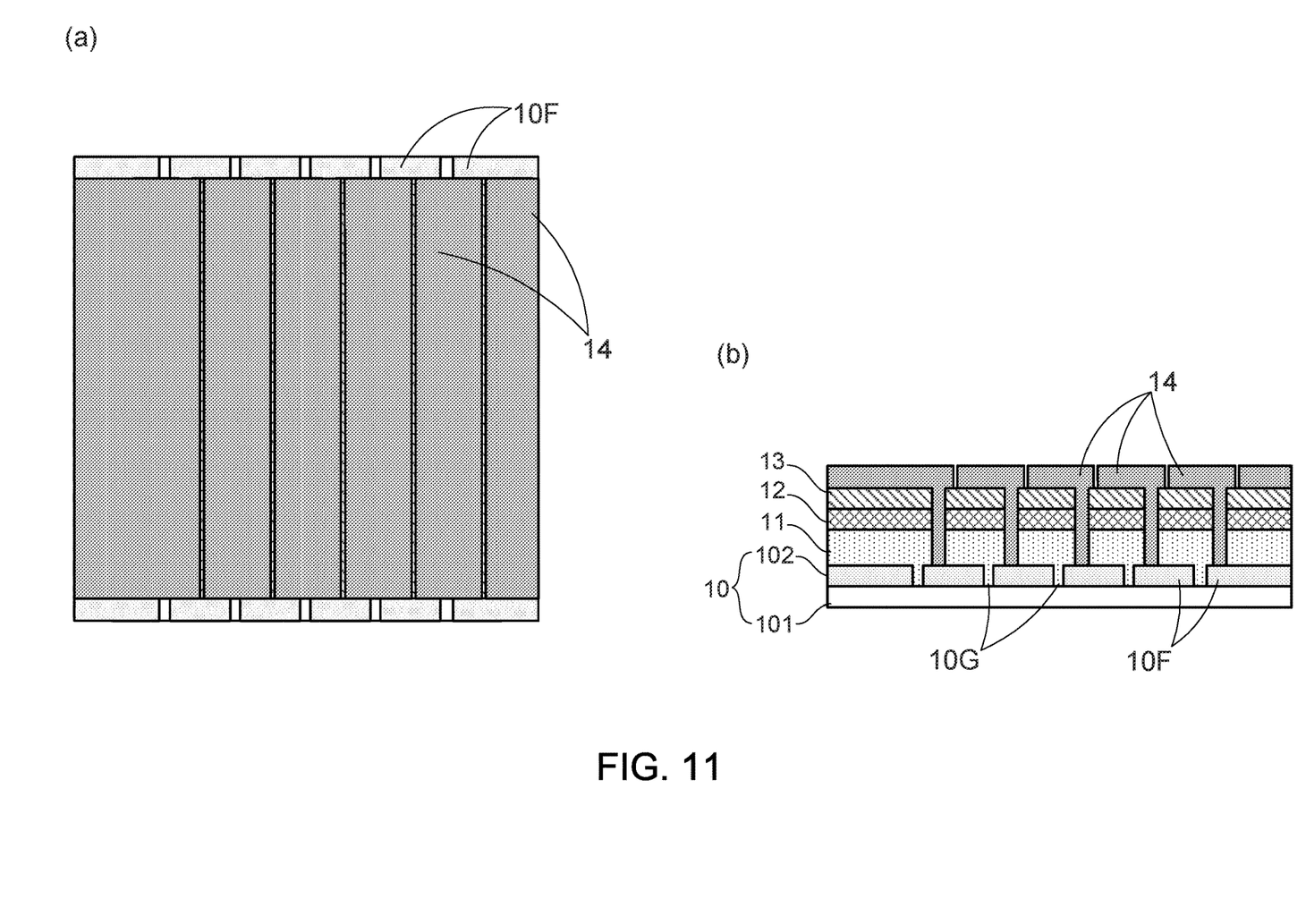
FIG. 11 shows a schematic diagram for describing the manufacturing process of the perovskite solar cell module.

FIG. 4 and FIG. 11 depict that the method flow is eventually proceeded to step S6: disposing a second mask over the plurality of electron transport films 13, and subsequently forming an electrical connection layer 14 on each of the plurality of electron transport films 13 through the second mask. For instance, thermal evaporation can be used for fabricating the electrical connection layers 14, wherein the electrical connection layer 14 13 is made of Au, Ag, or Al.

Through above descriptions, the method for manufacturing perovskite solar cell module that is disclosed by the present invention has been introduced completely and clearly; in summary, the present invention includes the advantages of:

(1) Conventional technology commonly separates a perovskite solar cell module to a plurality of solar cell units through laser scribing or mechanical scribing. The conventional technology has been found to cause damages on the solar cell units that are separated from the perovskite solar cell module. The present invention discloses a method for manufacturing perovskite solar cell module. When executing this novel method, a laser scribing is firstly adopted for forming a plurality of transparent conductive films 10F on a transparent substrate 101. Subsequently, by using an identical first mask, a plurality of hole transport films 11, a plurality of active layers 12, and a plurality of electron transport films 13 are sequentially formed on the transparent substrate 101. Consequently, by the use of a second mask, each of the ETLs 13 is formed with an electrical connection layer 14 thereon, such that a perovskite solar cell module 1 comprising a plurality of solar cell units is hence completed on the transparent substrate 101. It is worth explaining that, during the whole manufacturing process, each of the solar cell units is prevented from receiving bad influences that are provided by laser scribing or manufacture environment, such that each of the solar cell units is able to exhibit outstanding photoelectric conversion efficiency.

The above description is made on embodiments of the present invention. However, the embodiments are not intended to limit scope of the present invention, and all equivalent implementations or alterations within the spirit of the present invention still fall within the scope of the present invention.

What is claimed is:

1. A method for manufacturing perovskite solar cell module, comprising following steps:
   (1) providing a transparent conductive substrate that comprises a transparent substrate and a transparent conductive layer formed on the transparent substrate;
   (2) scribing the transparent conductive layer by using a laser beam, thereby forming a plurality of scribe lines on the transparent conductive layer, such that the transparent conductive layer is divided into a plurality of transparent conductive films by the plurality of scribe lines;
   (2a) applying a surface treatment to the transparent substrate that is provided with the plurality of transparent conductive films thereon;
   (3) positioning a first mask over the plurality of transparent conductive films, and then forming a plurality of hole transport films respectively on the plurality of transparent conductive films through the first mask, wherein each of the plurality of hole transport films has a thickness in a range between 5 nm and 60 nm;
   (4) letting the first mask be disposed over the plurality of hole transport films, and subsequently forming a plurality of active layers respectively on the plurality of hole transport films by using the first mask in combination with a vacuum coating apparatus, wherein a vacuum coating temperature of the vacuum coating apparatus is modulated to be in a range between 70° C. and 150° C., and a layer width of each of the plurality of active layers and a layer width of each of the plurality of transparent conductive films having a width ratio that is in a range between 0.75 and 9;
   (5) positioning the first mask over the plurality of active layers, and then forming a plurality of electron transport films respectively on each of the plurality of active layers by using the first mask in combination with the vacuum coating apparatus, wherein a flow rate of an oxygen feeding into the vacuum coating apparatus is modulated to be in a range between 0.1 sccm and 5 sccm; and
   (6) disposing a second mask over the plurality of electron transport films, and subsequently forming an electrical connection layer on each of the plurality of electron transport films through the second mask.

2. The method of claim 1, wherein the transparent conductive layer is made of a transparent conductive material that is selected from the group consisting of indium tin oxide (ITO), fluorine-doped tin oxide (FTO), indium zinc oxide (IZO), gallium-doped zinc oxide (GZO), and aluminum-doped zinc oxide (AZO).

3. The method of claim 1, wherein the hole transport film is made of an oxide that is selected from the group consisting of NiO and $MoO_3$.

4. The method of claim 1, wherein a manufacturing material of the electron transport film is selected from the group consisting of fullerene ($C_{60}$), fullerene derivative (PCBM), $TiO_2$, and ZnO.

5. The method of claim 1, wherein a manufacturing material of the electrical connection layer is selected from the group consisting of Al, Ag, and Au.

6. The method of claim 1, wherein there is a thermal annealing step arranged between the step (3) and the step (4), and the thermal annealing step being configured for applying a thermal annealing treatment to the transparent substrate that is provided with the plurality of hole transport films and the plurality of transparent conductive films thereon, wherein a processing temperature of the thermal annealing treatment is in a range between 300° C. and 500° C.

7. The method of claim 1, wherein the step (4) comprises following detail steps:
   (41) positioning the first mask over the plurality of hole transport films;
   (42) forming a plurality of first material layers respectively on the plurality of hole transport films through the first mask, wherein the first material layer is made of a metal halide that is selected from the group consisting of $PbCl_2$, $PbBr_2$, $PbI_2$, $SnI_2$, and $GeI_2$;
   (43) forming a plurality of second material layers respectively on the plurality of first material layers through the first mask, wherein a manufacturing material of the second material layer is selected from the group consisting of CsCl, CsBr, CsI, $CH_3NH_3Cl$, $CH_3NH_3Br$, $CH_3NH_3I$, and $H_2N\!=\!CHNH_2I$; and
   (44) letting a reaction between each of the plurality of first material layers and each of the plurality of second material layers be achieved, thereby making the plurality of active layers be respectively formed on the plurality of hole transport films, wherein each of the plurality of active layers has a thickness that is in a range between 200 nm and 500 nm.

8. The method of claim 1, wherein a perovskite solar cell module comprising a plurality of perovskite solar cell units is therefore fabricated after the steps (1)-(6) are completed.

* * * * *